United States Patent
Yang

(10) Patent No.: US 8,569,180 B2
(45) Date of Patent: Oct. 29, 2013

(54) METHOD AND STRUCTURE OF WAFER LEVEL ENCAPSULATION OF INTEGRATED CIRCUITS WITH CAVITY

(75) Inventor: Xiao (Charles) Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 41 days.

(21) Appl. No.: 13/542,637

(22) Filed: Jul. 5, 2012

(65) Prior Publication Data
US 2012/0276677 A1  Nov. 1, 2012

Related U.S. Application Data

(60) Division of application No. 12/634,663, filed on Dec. 9, 2009, now Pat. No. 8,227,911, which is a continuation of application No. 12/499,029, filed on Jul. 7, 2009, now abandoned.

(60) Provisional application No. 61/079,115, filed on Jul. 8, 2008.

(51) Int. Cl.
*H01L 21/461* (2006.01)

(52) U.S. Cl.
USPC ........... 438/731; 438/706; 438/729; 438/734; 257/E21.305; 257/E21.483

(58) Field of Classification Search
USPC ............... 438/710, 712, 731, 706, 729, 734; 257/E21.305, 483
See application file for complete search history.

(56) References Cited

U.S. PATENT DOCUMENTS

| | | | |
|---|---|---|---|
| 7,943,412 B2 * | 5/2011 | Buchwalter et al. | 438/51 |
| 8,227,911 B1 | 7/2012 | Yang et al. | |
| 2006/0205106 A1 * | 9/2006 | Fukuda et al. | 438/52 |
| 2008/0283991 A1 | 11/2008 | Reinert | |
| 2010/0075481 A1 | 3/2010 | Yang | |

OTHER PUBLICATIONS

Notice of Allowance for U.S. Appl. No. 12/634,663, mailed on Mar. 21, 2012, 8 pages.
Non-Final Office Action for U.S. Appl. No. 12/634,663, mailed on Oct. 13, 2011, 8 pages.
Requirement for Restriction/Election for U.S. Appl. No. 12/634,663; mailed on Aug. 4, 2011, 5 pages.

\* cited by examiner

*Primary Examiner* — Minchul Yang
(74) *Attorney, Agent, or Firm* — Kilpatrick Townsend and Stockton LLP

(57) ABSTRACT

The present invention is related shielding integrated devices using CMOS fabrication techniques to form an encapsulation with cavity. The integrated circuits are completed first using standard IC processes. A wafer-level hermetic encapsulation is applied to form a cavity above the sensitive portion of the circuits using IC-foundry compatible processes. The encapsulation and cavity provide a hermetic inert environment that shields the sensitive circuits from EM interference, noise, moisture, gas, and corrosion from the outside environment.

18 Claims, 6 Drawing Sheets

5. dep 2nd layer     a-Si, SOG, spray-on glass, metal, or combo

Hermetic seal, vacuum or inert gas 6. dep 3rd layer (optional)

7. Bond pad opening

8. Wafer bumping (optional)

1. dep 2nd layer 2. etch opening and expose bond pads 3. metalization 4. patterning metal, bond pads, or wafer bumping 1. Sacrificial material dep and pattern 2. PVD 1st layer 3. Remove sac 4. Dep 2nd layer     a-Si, SOG, spray-on glass, metal, or combo

METHOD AND STRUCTURE OF WAFER LEVEL ENCAPSULATION OF INTEGRATED CIRCUITS WITH CAVITY

CROSS-REFERENCES TO RELATED APPLICATIONS

This application is a divisional application of U.S. patent application Ser. No. 12/634,663 filed Dec. 9, 2009, which is a continuation of U.S. patent application Ser. No. 12/499,029 filed Jul. 7, 2009, which claims priority to U.S. Provisional Application No. 61/079,115 filed Jul. 8, 2008, all of which are commonly assigned and incorporated by reference in its entirety for all purposes herein.

BACKGROUND OF THE INVENTION

The present invention is related encapsulating integrated devices. More particularly, the present invention provides a method and device using CMOS fabrication techniques for encapsulating integrated circuits with cavity. Merely by way of example, the encapsulation can be applied to RF integrated circuits, timing circuits, analog circuits, power circuits, SAW, FBAR, or any other semiconductor devices that are sensitive to ambient interference and changes.

High frequency integrated circuits such as RF and timing circuits are widely used in electronic applications to provide stable frequency selection or referencing. The stability of these circuits, however, is susceptible to EM interference, noise, moisture, corrosion, and gas from the environment.

Thus, it is desirable to improve the stability of timing circuits, RF circuits, and the like.

BRIEF SUMMARY OF THE INVENTION

The present invention is related encapsulating integrated devices. More particularly, the present invention provides a method and device using CMOS fabrication techniques for encapsulating integrated circuits with cavity.

First, the integrated circuits are completed using standard IC processes. A wafer-level hermetic encapsulation is applied to form a cavity above the sensitive portion of the circuits using IC-foundry compatible processes. The encapsulation and cavity provide a hermetic inert environment that shields the sensitive circuits from EM interference, noise, moisture, gas, and corrosion from the outside environment.

DETAILED DESCRIPTION OF THE INVENTION

Figure 1:
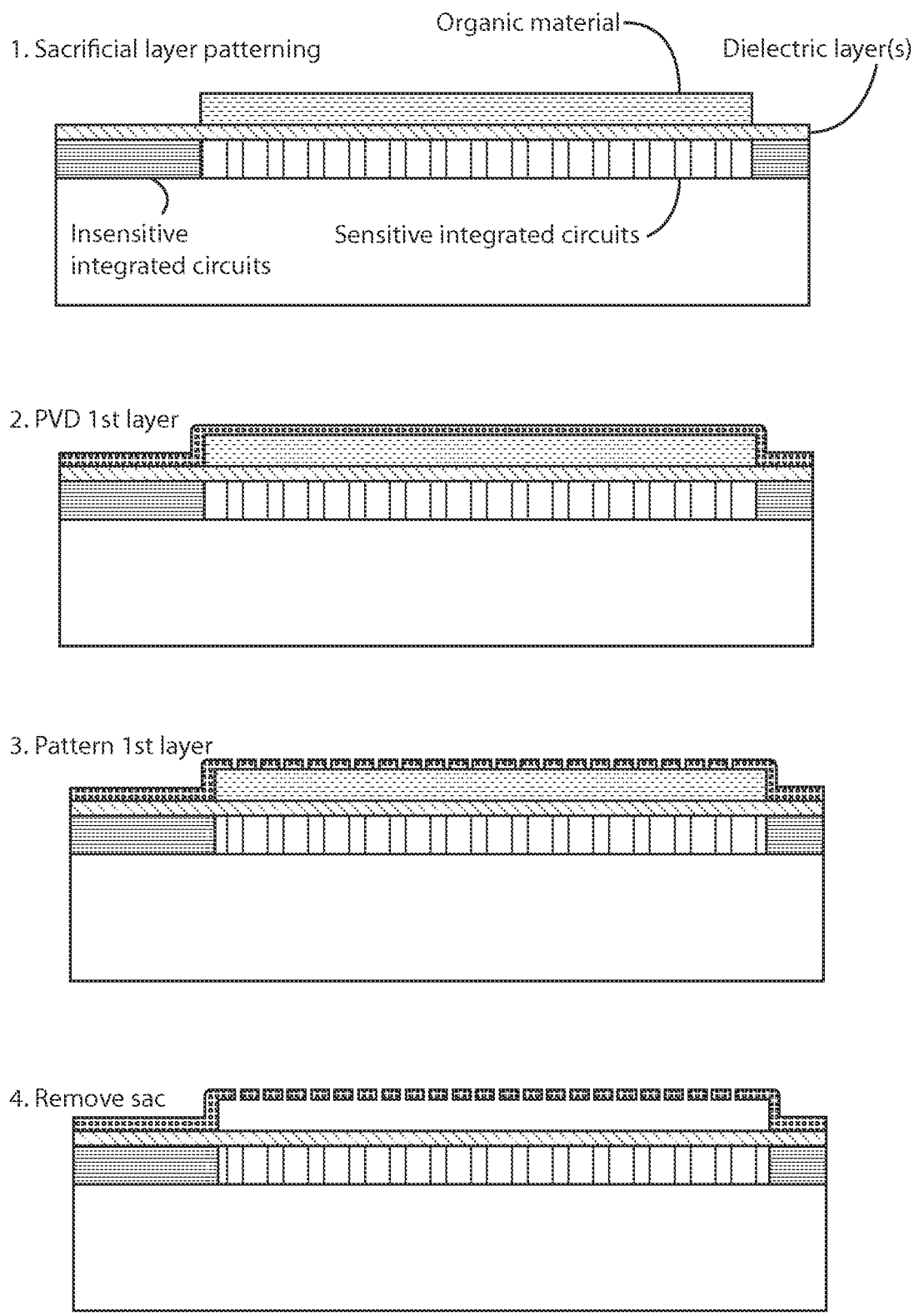
FIG. 1 is a simplified process flow of a wafer-level encapsulation of Integration Circuits according to one embodiment of the present invention.

FIG. 1 is a simplified process flow of a wafer-level encapsulation of Integration Circuits according to one embodiment of the present invention. As depicted, an organic sacrificial material is deposited and patterned to cover the sensitive portion of the integrated circuits. In a specific embodiment, the sacrificial material is a photo resist that is spin coated on the wafer and patterned using standard lithography methods. A thin layer of metal or amorphous silicon is then conformally deposited using a PVD process covering the surface of the wafer. A etch step is followed to form release holes in the 1st layer. Lastly, the organic sacrificial material is then removed through the release holes by a dry O2 plasma ashing step. As depicted, the removal of the sacrificial material forms a cavity and a shell of the encapsulation.

Figure 2:
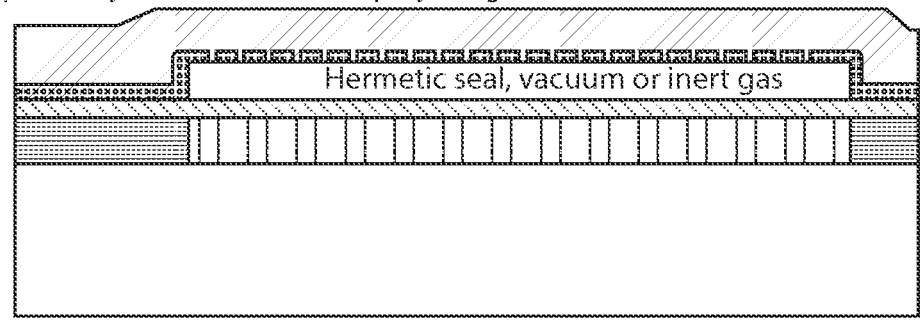
FIG. 2 is a simplified process flow of a wafer-level encapsulation of Integration Circuits according to one embodiment of the present invention.
Figure 2:
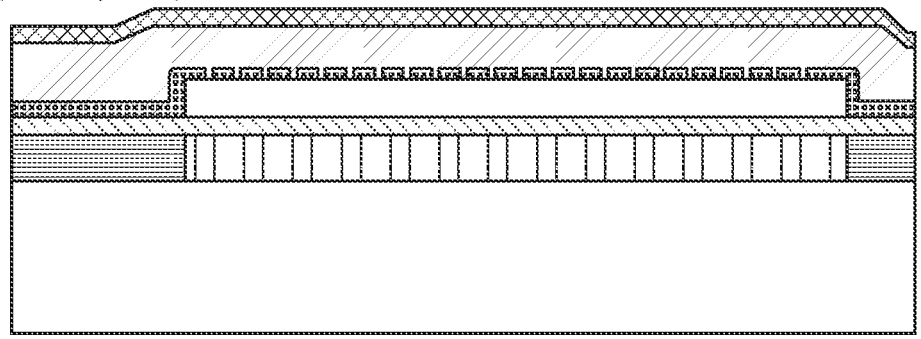
Figure 2:
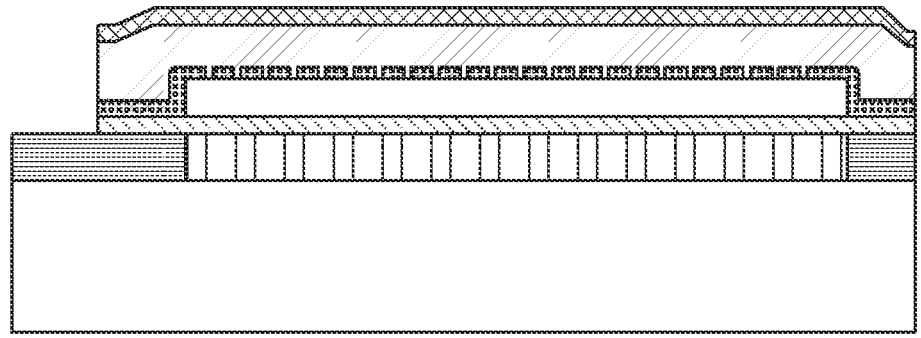
Figure 2:
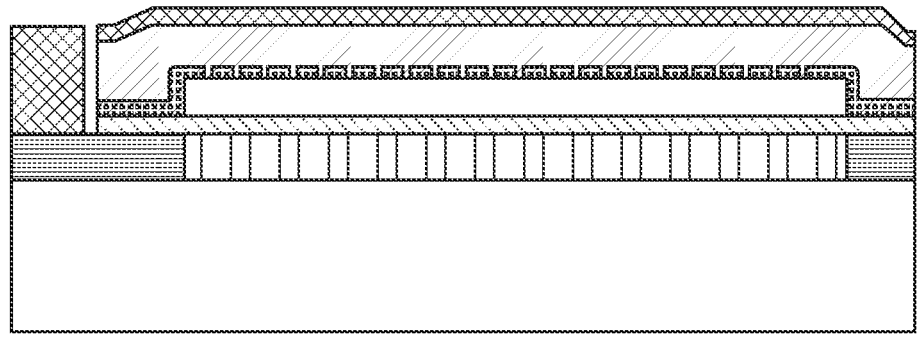

FIG. 2 is a simplified process flow of a wafer-level encapsulation of Integration Circuits according to one embodiment of the present invention. As depicted, a 2nd layer of the encapsulation is deposited onto the 1st layer. The hermetic sealing methods include PVD, spin-on, or spray-on techniques. The sealing materials include metal such as Ti, TiN, amorphous silicon, spin-on-glass, spray-on-glass, or a combination of the above. The ambient during sealing is optimized and controlled to a desired spec that defines the sensor device ambient after sealing. A getter material such as Ti can be deposited as the 1st layer of the encapsulation and activated later to achieve high vacuum and cleanness of the sensitive circuit ambient environment. After sealing the holes, an optional CVD dielectric material such as oxide or nitride can be added onto the encapsulation. Finally, a etch step opens the bond pad region and expose the bond pads for wire bonding or optional wafer bumping processes. The encapsulation and the cavity form a hermetic inert environment that shields the sensitive circuits from EM interference, noise, moisture, gas, and corrosion from the outside environment.

Figure 3:
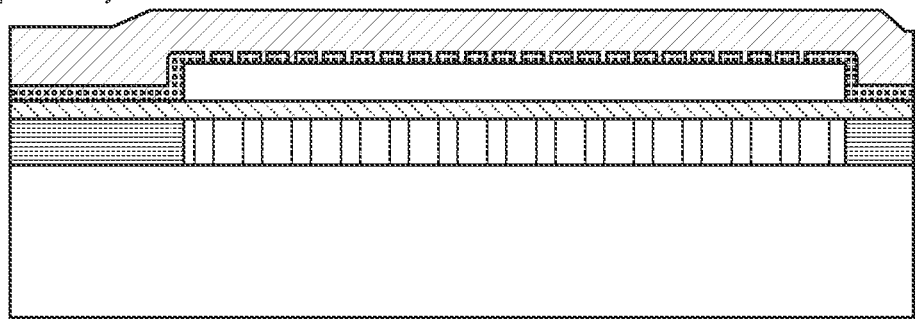
FIG. 3 is a simplified process flow of a wafer-level encapsulation of Integration Circuits according to one embodiment of the present invention.
Figure 3:
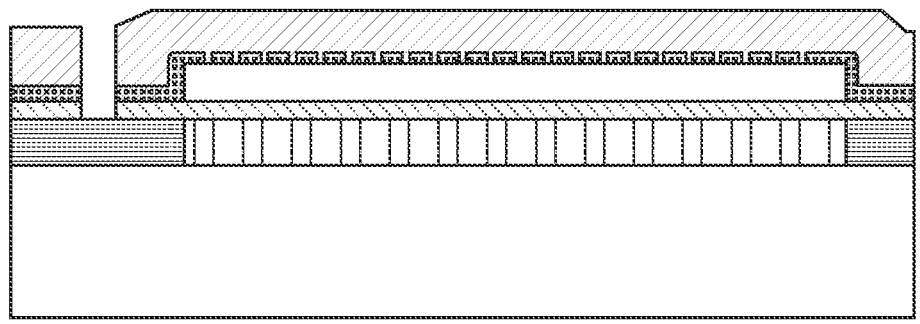
Figure 3:
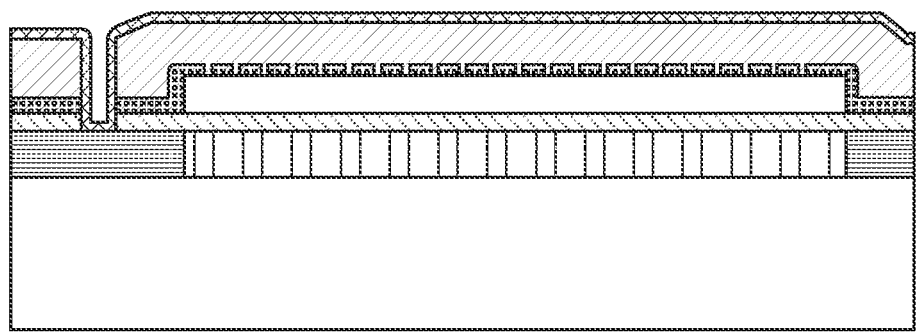
Figure 3:
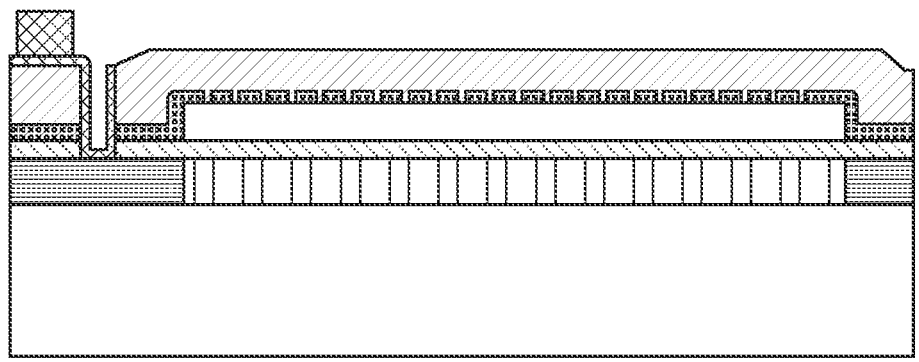

FIG. 3 is a simplified process flow of a wafer-level encapsulation of Integration Circuits according to one embodiment of the present invention. For applications that require thick encapsulation layer, it is desirable to form bond pads on top of the encapsulation layer instead of etching down to open the bond pads on the IC layer. As depicted, after depositing the 2nd layer of the encapsulation, a etch step opens a region of bond pad area and expose the bond pads for a subsequent metallization step. The metal is then patterned to form bond pads for wire bonding or optional wafer bumping processes.

Figure 4:
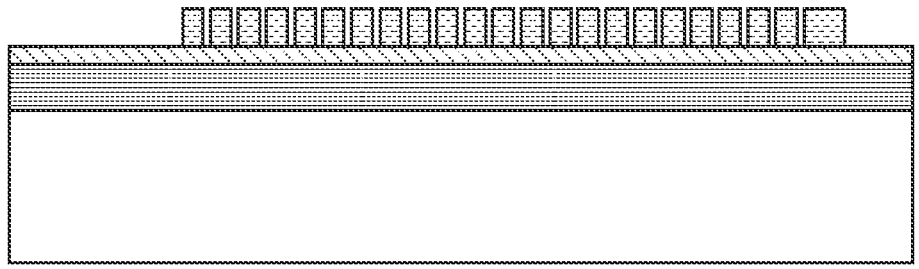
FIG. 4 is a simplified process flow of a wafer-level encapsulation of Integration Circuits according to one embodiment of the present invention.
Figure 4:
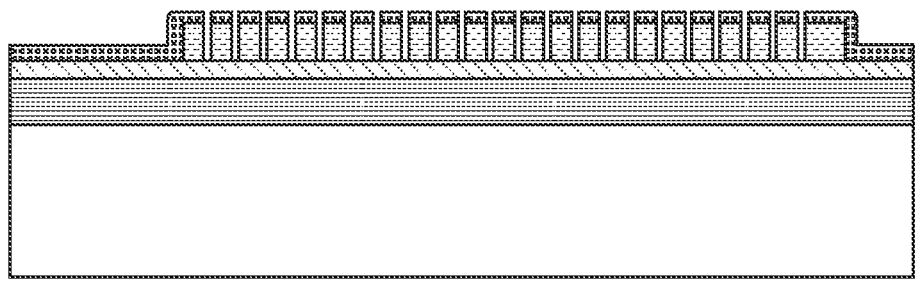
Figure 4:
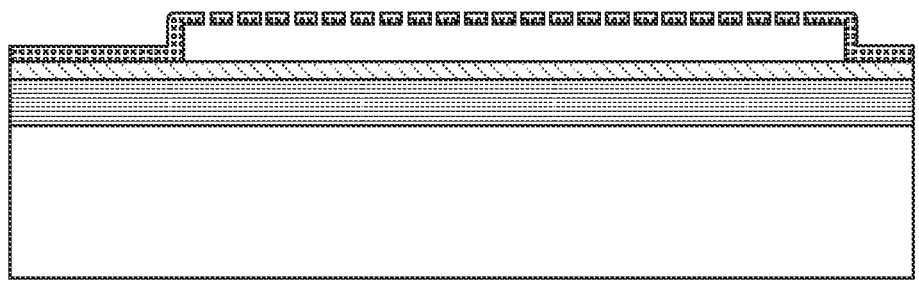
Figure 4:
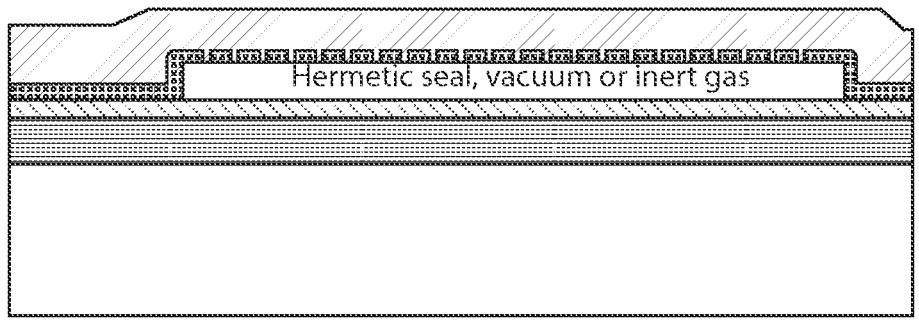

FIG. 4 is a simplified process flow of a wafer-level encapsulation of Integration Circuits according to one embodiment of the present invention. As depicted, an organic sacrificial material is deposited and patterned to cover the sensitive portion of the integrated circuits. The patterning also forms holes or openings in the remaining organic materials. In a specific embodiment, the sacrificial material is a photo resist that is spin coated on the wafer and patterned using standard lithography methods. A thin layer of metal or amorphous silicon is then deposited using a PVD process covering the surface of the wafer. The deposition recipe is optimized for non-conforming purpose, which has little step coverage of the sidewall of the exposed photoresist trenches. After removing the organic sacrificial material, a 2nd layer is then deposited to form the cavity and the encapsulation by steps aforementioned. This flow uses only one mask and save process steps.

Figure 5:
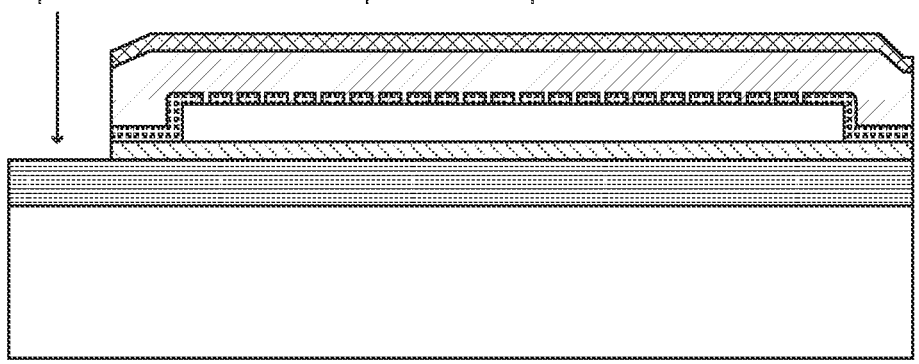
FIG. 5 is a simplified cross section of a wafer-level encapsulation of Integration Circuits according to one embodiment of the present invention.

FIG. 5 is a simplified cross section of a wafer-level encapsulation of Integration Circuits according to one embodiment of the present invention. As depicted, bond pad area is kept clear from encapsulation depositions by a lift-off method or using shadow mask. This eliminates the need of etching thru the encapsulation layers to expose the bond pads.

Figure 6:
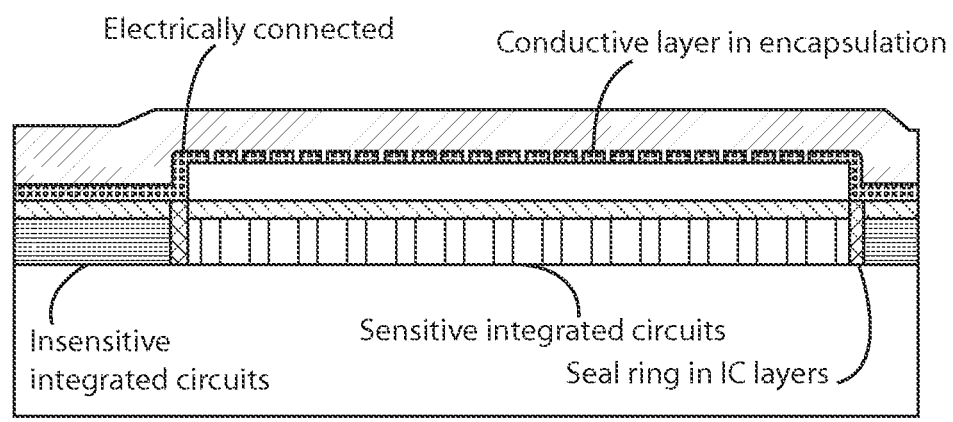
FIG. 6 is a simplified cross section of a wafer-level encapsulation of Integration Circuits according to one embodiment of the present invention.

FIG. 6 is a simplified cross section of a wafer-level encapsulation of Integration Circuits according to one embodiment of the present invention. As depicted, a seal ring is formed in IC layers and encircles the sensitive portion of the integrated circuits. The 1st layer of the encapsulation is a conductive material and is electrically connected with the seal ring. As a result, the seal ring and the encapsulation form a metal cage that shields the sensitive circuits from EM interference, noise, moisture, gas, and corrosion from the environment.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated circuit, the method comprising:
    providing a first semiconductor substrate having a first surface region;
    forming one or more CMOS integrated circuit (IC) devices provided on a CMOS IC device region overlying the first surface region, the CMOS IC device region having a CMOS surface region;
    forming a dielectric layer overlying the CMOS surface region;
    forming a sacrificial layer overlying a portion of the dielectric layer;
    forming an enclosure layer overlying the sacrificial layer;
    removing the sacrificial layer via an ashing process to form a void region between the portion of the dielectric layer and the enclosure layer;
    sealing the void region in a predetermined environment, wherein sealing the void region comprises forming a barrier material overlying at least the void region to hermetically seal the one or more CMOS IC devices;
    forming a seal ring encircling the CMOS IC devices, the seal ring being electrically coupled with the barrier material to shield the one or more CMOS IC devices.

2. The method of claim 1 wherein the one or more CMOS IC devices are formed using a standard CMOS process from a semiconductor foundry.

3. The method of claim 1 wherein the enclosure layer comprises titanium material, the titanium material being activated as a getter layer.

4. The method of claim 1 wherein the enclosure layer is selected from a metal, a semiconductor material, an amorphous silicon material, a dielectric layer, or a combination of these layers.

5. The method of claim 1 wherein forming the void region comprises a forming a void volume comprising vacuum, air, an inert material, or an inert gas.

6. The method of claim 1 wherein forming the void region comprises a forming a void volume that is characterized by a dielectric constant of 1.2 and less.

7. The method of claim 1 wherein forming the one or more CMOS IC devices comprises forming at least one of an RC timing circuit, LC timing circuit, RF circuit, or analog circuit.

8. A method for forming high quality silicon material for photovoltaic devices, the method comprising:
    providing a semiconductor substrate having a surface region, a first portion and a second portion;
    forming one or more CMOS integrated circuit (IC) on the first portion of the semiconductor substrate;
    forming one or more sensitive integrated circuit (IC) modules provided on a second portion of the semiconductor substrate, wherein the one or more sensitive integrated circuit (IC) modules are sensitive to ambient interference and changes;
    forming a seal ring encircling the one or more sensitive integrated circuit modules;
    forming one or more dielectric layers overlying the one or more CMOS IC devices and the one or more sensitive IC modules to form a passivation structure overlying the one or more CMOS IC devices and the one or more sensitive IC modules;
    forming a sacrificial layer overlying a portion of the one or more dielectric layers;
    forming an enclosure layer overlying the sacrificial layer;
    removing the sacrificial layer via an ashing process to form a void region between the portion of the dielectric layer and the enclosure layer; and
    sealing the void region in a predetermined environment.

9. The method of claim 8 wherein sealing the void region comprises forming a barrier material overlying at least the void region to hermetically seal the one or more sensitive IC modules while maintaining the void region overlying the one or more dielectric layers.

10. The method of claim 9 wherein the barrier material is electrically coupled with the seal ring to shield the one or more sensitive IC modules.

11. The method of claim 9 further comprising one or more dielectric layers overlying the barrier material.

12. The method of claim 9 wherein the barrier material is selected from a group consisting of: amorphous silicon, polysilicon, silicon germanium, and germanium.

13. The method of claim 9 wherein the barrier material is selected from a group consisting of: tungsten, platinum, titanium, titanium nitride, titanium tungsten, copper, tantalum, aluminum, or aluminum titanium alloy.

14. The method of claim 9 wherein the barrier material is selected from a group consisting of: an oxide, a nitride, an oxynitride, a spin-on-glass, and a spray-on glass.

15. The method of claim 9 wherein the barrier material comprises a semiconductor, a metal, or a dielectric.

16. The method of claim 8 wherein the void region comprises a void volume selected from a group consisting of: air, an inert material, an inert gas, a vacuum.

17. The method of claim 16 wherein the void volume is characterized by a dielectric constant of 1.2 and less.

18. The method of claim 16 wherein the one or more sensitive IC modules comprises one or more of an RC timing circuit, LC timing circuit, RF circuit, or analog circuit.

* * * * *